United States Patent
Yang et al.

(10) Patent No.: US 10,692,568 B2
(45) Date of Patent: Jun. 23, 2020

(54) MEMORY DEVICE CAPABLE OF RELEASING STRESS VOLTAGE

(71) Applicant: M31 TECHNOLOGY CORPORATION, Zhubei, Hsinchu County (TW)

(72) Inventors: Shyh-Chyi Yang, Zhubei (TW); Wei-Chiang Shih, Zhubei (TW)

(73) Assignee: M31 TECHNOLOGY CORPORATION, Zhubei (TW)

(*) Notice: Subject to any disclaimer, the term of this patent is extended or adjusted under 35 U.S.C. 154(b) by 0 days.

(21) Appl. No.: 16/130,807

(22) Filed: Sep. 13, 2018

(65) Prior Publication Data

US 2019/0088311 A1    Mar. 21, 2019

Related U.S. Application Data (60) Provisional application No. 62/558,868, filed on Sep. 15, 2017.

(51) Int. Cl.
| | |
|---|---|
| *G11C 11/419* | (2006.01) |
| *G11C 7/10* | (2006.01) |
| *G11C 11/412* | (2006.01) |
| *G11C 11/413* | (2006.01) |

(52) U.S. Cl.
CPC .......... *G11C 11/419* (2013.01); *G11C 7/1096* (2013.01); *G11C 11/412* (2013.01); *G11C 11/413* (2013.01)

(58) Field of Classification Search
None
See application file for complete search history.

(56) References Cited

U.S. PATENT DOCUMENTS

| | | | | |
|---|---|---|---|---|
| 9,412,438 | B2 * | 8/2016 | Fan | G11C 11/419 |
| 9,779,802 | B1 * | 10/2017 | Chang | G11C 11/419 |
| 2007/0109878 | A1 * | 5/2007 | Gouin | G11C 11/419 |
| | | | | 365/189.11 |
| 2007/0268738 | A1 * | 11/2007 | Heinrich-Barna | G11C 11/412 |
| | | | | 365/149 |
| 2010/0188909 | A1 * | 7/2010 | Kenkare | G11C 11/419 |
| | | | | 365/189.16 |
| 2017/0117034 | A1 * | 4/2017 | Hebig | G11C 11/419 |

* cited by examiner

*Primary Examiner* — Douglas King
(74) *Attorney, Agent, or Firm* — Hamre, Schumann, Mueller & Larson, P.C.

(57) ABSTRACT

A memory device includes: at least one memory cell; a bit line connected to the at least one memory cell; a write controller; a write driver receiving a logic signal from an output terminal of the write controller, and driving the bit line based on the logic signal; a negative voltage generator generating a reference voltage for receipt by a ground terminal of the write driver; and a protector connected to one of a power terminal and the output terminal of the write controller. The protector is capable of releasing stress voltage of the write driver.

11 Claims, 7 Drawing Sheets

MEMORY DEVICE CAPABLE OF RELEASING STRESS VOLTAGE

CROSS-REFERENCE TO RELATED APPLICATION

This application claims priority of U.S. Provisional Patent Application No. 62/558,868, filed on Sep. 15, 2017.

FIELD

The disclosure relates to a memory device, and more particularly to a memory device capable of releasing high stress voltage resulting from usage of negative bit line techniques.

BACKGROUND

As semiconductor technology advances, a supply voltage required for powering a memory device has become lower. Under a circumstance where a fabrication process of the memory device varies to a worst corner, write operations of the memory device may fail because of an insufficient operation voltage range. In order to solve this problem, negative bit line (NBL) techniques are proposed and widely used in various types of memory devices (including static random access memory (SRAM) devices), so as to increase the operation voltage range during the write operations.

Figure 1:
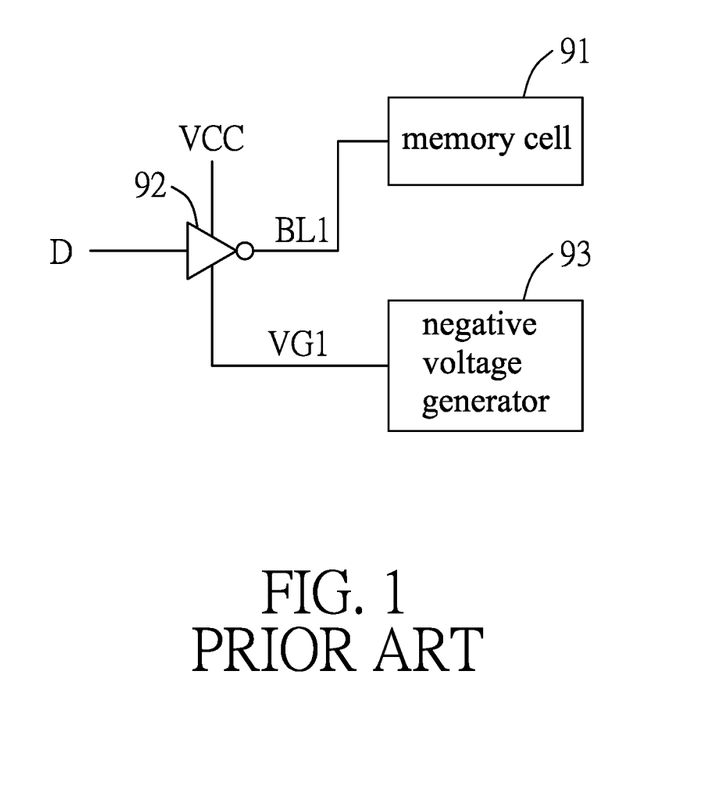
FIG. 1 is a circuit block diagram illustrating a conventional static random access memory device.

FIG. 1 illustrates a conventional SRAM device that uses the NBL techniques. For convenience of illustration of the conventional SRAM device, one of memory cells (e.g., the memory cell 91), one of non-inverting bit lines (e.g., the non-inverting bit line (BL1)), one of write drivers (e.g., the write driver 92) and one of negative voltage generators (e.g., the negative voltage generator 93) are depicted in FIG. 1 and will be described in detail below, the write driver 92 is represented as an inverter in FIG. 1, and inverting bit lines, non-inverting word lines and inverting word lines are all omitted in FIG. 1 and the following description.

The non-inverting bit line (BL1) is connected to the memory cell 91. The write driver 92 has a power terminal that is for receiving a supply voltage (VCC), a ground terminal, an input terminal that is for receiving a logic signal (D), and an output terminal that is connected to the non-inverting bit line (BL1). The negative voltage generator 93 is connected to the ground terminal of the write driver 92, and generates, for receipt by the ground terminal of the write driver 92, a reference voltage (VG1) that is selectively equal to or lower than a ground voltage.

When logic zero is to be written to the memory cell 91, the logic signal (D) is in a logic one state and has a voltage equal to the supply voltage (VCC) of, for example, 1 Volt, and the reference voltage (VG1) is lower than the around voltage by, for example, several hundred milli-Volts, so a signal at the non-inverting bit line (BL1) is in a logic zero state and has a voltage lower than the ground voltage, thereby increasing an operation voltage range of the conventional SRAM device. However, at this time, a voltage between the input terminal and the ground terminal of the write driver 92 is higher than the supply voltage (VCC), and the write driver 92 may endure overly high stress voltage and may be damaged when this voltage is greater than a designed value (e.g., 1.4 times the supply voltage (VCC)) because of fabrication variations of the conventional SRAM device. In other words, the NBL techniques can increase the operation voltage range to prevent write failures of the conventional SRAM device, but may induce overly high stress voltage endured by each write driver to result in shortened lifetime of the conventional SRAM device.

SUMMARY

Therefore, an object of the disclosure is to provide a memory device that can release high stress voltage resulting from usage of negative bit line techniques.

According to the disclosure, the memory device includes at least one memory cell, a bit line, a write controller, a write driver, a negative voltage generator and a protector. The bit line is connected to the at least one memory cell. The write controller has a power terminal, and an output terminal that outputs a logic signal. The write driver has a ground terminal, an input terminal that is connected to the output terminal of the write controller for receiving the logic signal therefrom, and an output terminal that is connected to the bit line. The negative voltage generator is connected to the ground terminal of the write driver, is for receiving a write control signal and a ground voltage, and generates a reference voltage for receipt by the ground terminal of the write driver. The reference voltage is lower than the ground voltage when the write control signal is in a first logic state, and is equal to the ground voltage when the write control signal is in a second logic state. The protector is connected to one of the power terminal and the output terminal of the write controller.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
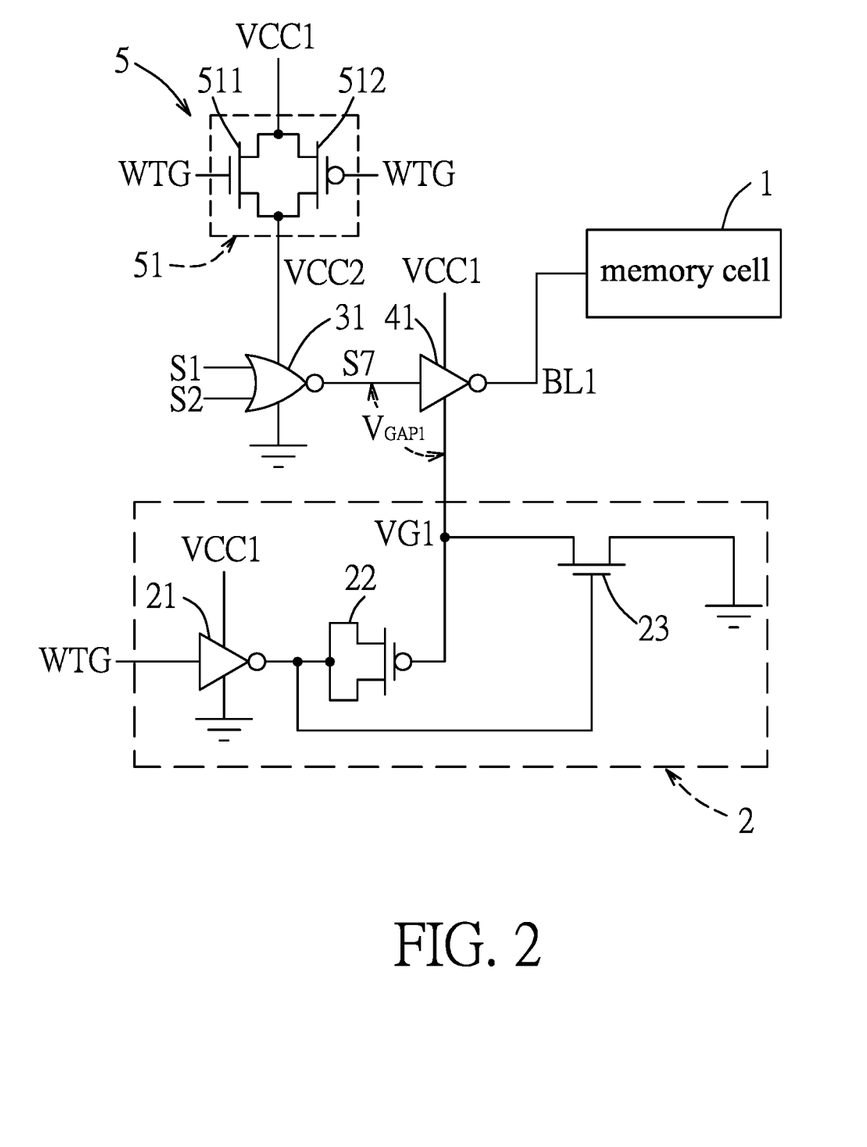
FIG. 2 is a circuit block diagram illustrating a first embodiment of a memory device according to the disclosure.

Referring to FIG. 2, a first embodiment of a memory device according to the disclosure is, for example, a static random access memory (SRAM) device, and includes a plurality of memory cells, a plurality of non-inverting bit lines, a plurality of inverting bit lines, a plurality of non-inverting word lines, a plurality of inverting word lines, a plurality of write circuit, at least one negative voltage generator, at least one protector and other elements. For convenience of illustration of this embodiment and without influencing technical integrity of this embodiment, a memory cell 1, a bit line (BL1) (which may be a non-inverting bit line or an inverting bit line), a write circuit 3 (which includes a write controller 31 and a write driver 41), a negative voltage generator 2 and a protector 5 are depicted in FIG. 2 and will be described in detail below, and elements other than these ones are omitted in FIG. 2 and the following description.

The bit line (BL1) is connected to the memory cell 1. It should be noted that the bit line (BL1) is generally connected to multiple memory cells, and that only one of the memory cells (i.e., the memory cell 1) is depicted in FIG. 2 for convenience of illustration of this embodiment.

The write controller 31 has a power terminal, a ground terminal that is for receiving a ground voltage, and an output terminal that outputs a logic signal (S7). In this embodiment, the write controller 31 is implemented using a two-input NOR gate that generates the logic signal (S7) based on two logic signals (S1, S2). The logic signal (S7) is in a logic one state when the logic signals (S1, S2) are both in a logic zero state. However, in other embodiments, the write controller 31 may be implemented using a logic gate other than the two-input NOR gate.

The write driver 41 has a power terminal that is for receiving a supply voltage (VCC1), a ground terminal, an input terminal that is connected to the output terminal of the write controller 31 for receiving the logic signal (S7) therefrom, and an output terminal that is connected to the bit line (BL1). In this embodiment, the write driver 41 is implemented using an inverter, but the disclosure is not limited thereto.

The negative voltage generator 2 is connected to the ground terminal of the write driver 41, is for receiving a write control signal (WTG) and the ground voltage, and generates, based on the write control signal (WTG) and the ground voltage, a reference voltage (VG1) for receipt by the ground terminal of the write driver 41. The reference voltage (VG1) is lower than the ground voltage when the write control signal (WTG) is in a first logic state (e.g., the logic one state), and is equal to the ground voltage when the write control signal (WTG) is in a second logic state (e.g., the logic zero state).

In this embodiment, the negative voltage generator 2 includes an inverter 21, a capacitance element 22 and a switch 23. The inverter 21 has a power terminal that is for receiving the supply voltage (VCC1), a ground terminal that is for receiving the ground voltage, an input terminal that is for receiving the write control signal (WTG), and an output terminal. The capacitive element 22 has a first terminal that is connected to the ground terminal of the write driver 41, and a second terminal that is connected to the output terminal of the inverter 21. The capacitive element 22 is implemented using a P-type transistor in this embodiment, but the disclosure is not limited thereto. The switch 23 has a first terminal that is for receiving the ground voltage, a second terminal that is connected to the first terminal of the capacitive element 22, and a control terminal that is connected to the output terminal of the inverter 21. The switch 23 does not conduct when the write control signal (WTG) is in the first logic state (i.e., the logic one state), and conducts when the write control signal (WTG) is in the second logic state (i.e., the logic zero state). The switch 23 is implemented using an N-type transistor in this embodiment, but the disclosure is not limited thereto. The reference voltage (VG1) is provided at the first terminal of the capacitive element 22.

When the write control signal (WTG) is in the second logic state (i.e., the logic zero state), the switch 23 conducts, making the reference voltage (VG1) equal to the ground voltage. Thereafter, when the write control signal (WTG) enters the first logic state (i.e., the logic one state), the switch 23 no longer conducts, and the reference voltage (VG1) is decreased below the ground voltage because of coupling effect provided by the capacitive element 22.

The protector 5 is connected to the power terminal of the write controller 31, is for receiving the write control signal (WTG) and the supply voltage (VCC1), and generates, based on the write control signal (WTG) and the supply voltage (VCC1), a reference voltage (VCC2) for receipt by the power terminal of the write controller 31. The reference voltage (VCC2) is lower than the supply voltage (VCC1) when the write control signal (WTG) is in the first logic state (i.e., the logic one state), and is equal to the supply voltage (VCC1) when the write control signal (WTG) is in the second logic state (i.e., the logic zero state). As a result, a voltage of the logic signal (S7) when being in the logic one state is lower when the write control signal (WTG) is in the first logic state than when the write control signal (WTG) is in the second logic state.

In this embodiment, the protector 5 includes a transmission gate 51. The transmission gate 51 includes an N-type transistor 511 and a P-type transistor 512. Each of the N-type and P-type transistors 511, 512 has a first terminal that is for receiving the supply voltage (VCC1), a second terminal that is connected to the power terminal of the write controller 31, and a control terminal that is for receiving the write control signal (WTG). The reference voltage (VCC2) is provided at the second terminal of the N-type transistor 511.

When the write control signal (WTG) is in the second logic state (i.e., the logic zero state), the P-type transistor 512 conducts while the N-type transistor 511 does not conduct, and the supply voltage (VCC1) is transmitted by the P-type transistor 512 to generate the reference voltage (VCC2) that is equal to the supply voltage (VCC1), so the voltage of the logic signal (S7) when being in the logic one state is equal to the supply voltage (VCC1). When the write control signal (WTG) is in the first logic state (i.e., the logic one state), the N-type transistor 511 conducts while the P-type transistor 512 does not conduct, and the supply voltage (VCC1) is transmitted by the N-type transistor 511 to generate the reference voltage (VCC2) that is lower than the supply voltage (VCC1) by a threshold voltage of the N-type transistor 511, so the voltage of the logic signal (S7) when being in the logic one state is lower than the supply voltage (VCC1).

As compared to the conventional SRAM device, stress voltage endured by the write driver 41 when the logic signal (S7) is in the logic one state is decreased without influencing power consumption and operation speed of the memory device of this embodiment, since the voltage of the logic signal (S7) when being in the logic one state is decreased below the supply voltage (VCC1) when the reference voltage (VG1) is decreased below the ground voltage. In other words, a voltage ($V_{GAP1}$) between the input terminal and the ground terminal of the write driver 41 when the logic signal (S7) is in the logic one state is lower than the voltage between the input terminal and the ground terminal of the write driver 92 (see FIG. 1) of the conventional SRAM device when the logic signal (D) (see FIG. 1) is in the logic one state.

Figure 3:
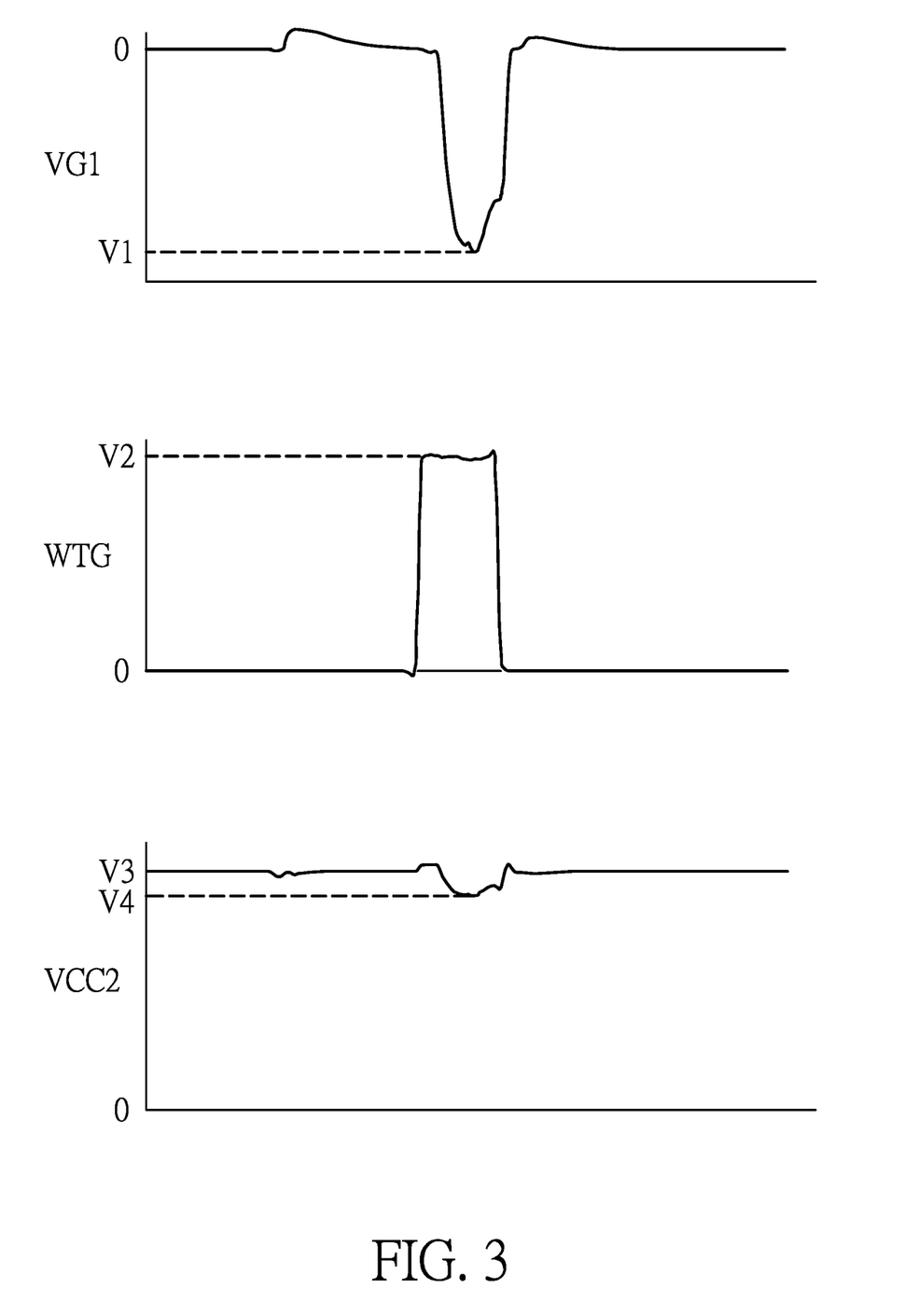
FIG. 3 is a timing diagram illustrating two reference voltages and a write control signal the first embodiment.

FIG. 3 exemplarily illustrates relationships among the reference voltages (VG1, VCC2) and the write control signal (WTG). When the write control signal (WTG) is in the second logic state (i.e., the logic zero state) and has a voltage equal to the ground voltage of 0 Volt, the reference voltage (VG1) is equal to the ground voltage, and the reference voltage (VCC2) is equal to the supply voltage (VCC1) of V3 Volts. When the write control signal (WTG) is in the first logic state (i.e., the logic one state) and has a voltage of V2 Volts, the reference voltage (VG1) is lower than the ground voltage and is V1 Volts, and the reference voltage (VCC2) is lower than the supply voltage (VCC1) and is V4 Volts. In this embodiment, a difference between 0 and V1 (i.e., 0−V1) is greater than a difference between V3 and V4 (i.e., V3−V4).

Referring back to FIG. 2, it should be noted that, in other embodiments, by properly modifying the negative voltage generator 2 and the protector 5 (e.g., increasing/decreasing a number of inverters, changing types of transistors, etc.), the first logic state can be the logic zero state instead of the logic one state, and the second logic state can be the logic one state instead of the logic zero state. In addition, the negative voltage generator 2 can be implemented in other ways.

Figure 4:
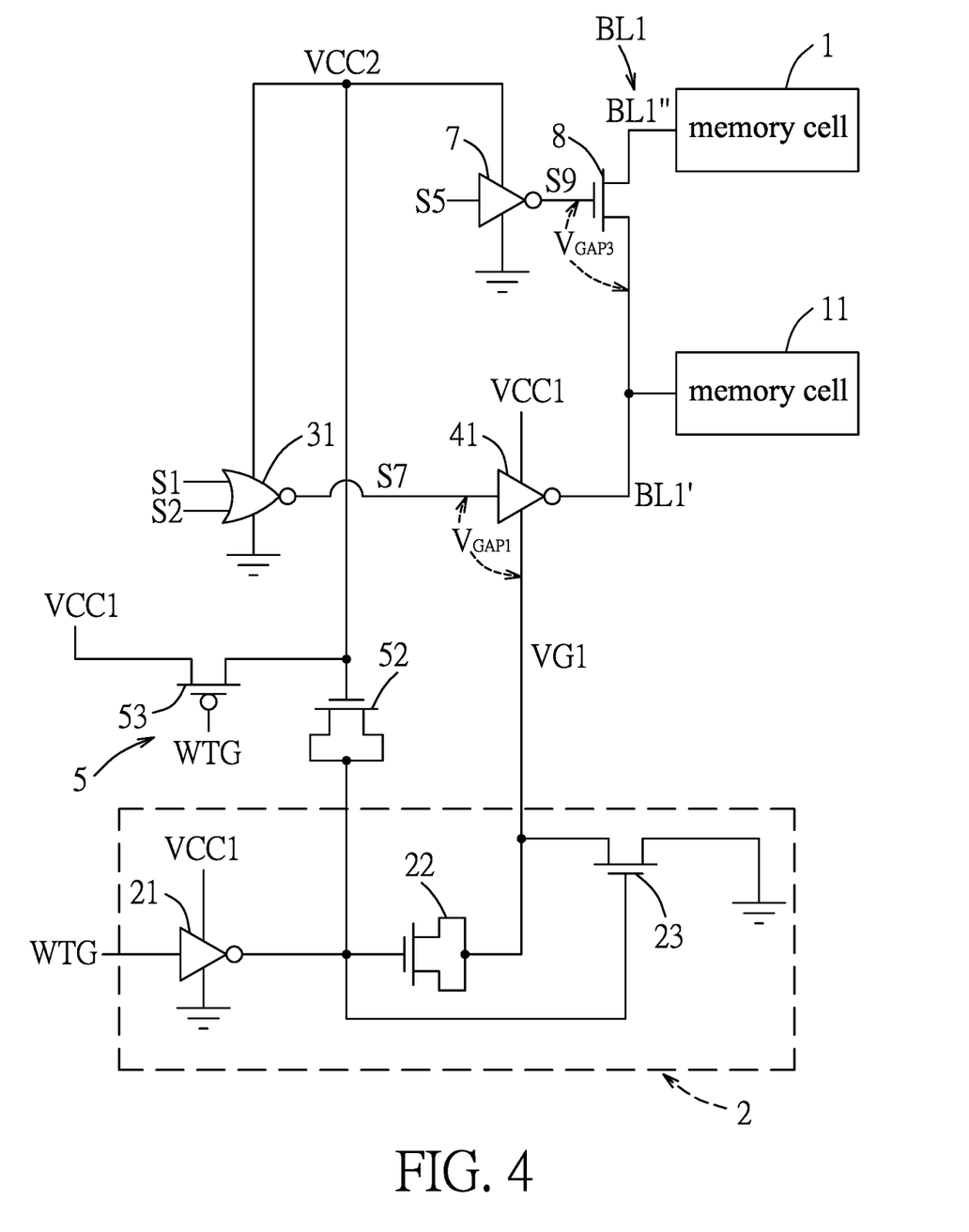
FIG. 4 is a circuit block diagram illustrating a second embodiment of the memory device according to the disclosure.

FIG. 4 illustrates a second embodiment of the memory device according to the disclosure. For convenience of illustration of this embodiment, two memory cells 1, 11, a bit line (BL1) (which may be a non-inverting bit line or an inverting bit line), a write controller 31, a write driver 41, a logic gate 7, a switch 8, a negative voltage generator 2 and a protector 5 of the memory device are depicted in FIG. 4 and will be described in detail below, and other elements of the memory device are omitted in FIG. 4 and the following description.

The bit line (BL1) includes two segments (BL", BL'), one of which (BL") is connected to the memory cell 1, and the other one of which (BL') is connected to the memory cell 11.

Similar to that of the first embodiment, the write controller 31 has a power terminal, a ground terminal that is for receiving a ground voltage, and an output terminal that outputs a logic signal (S7). The write controller 31 is also implemented using a two-input NOR gate that generates the logic signal (S7) based on two logic signals (S1, S2). The logic signal (S7) is in a logic one state when the logic signals (S1, S2) are both in a logic zero state. However, in other embodiments, the write controller 31 may be implemented using a logic gate other than the two-input NOR gate.

The write driver 41 has a power terminal that is for receiving a supply voltage (VCC1), a ground terminal, an input terminal that is connected to the output terminal of the write controller 31 for receiving the logic signal (S7) therefrom, and an output terminal that is connected to the segment (BL1').

The logic gate 7 has a power terminal, a ground terminal that is for receiving the ground voltage, and an output terminal that outputs a logic signal (S9). In this embodiment, the logic gate 7 is implemented using an inverter that generates the logic signal (S9) based on a logic signal (S5). The logic signal (S9) is in the logic one state when the logic signal (S5) is in the logic zero state. However, in other embodiments, the logic gate 7 may be implemented using a logic gate other than the inverter.

The switch 8 has a first terminal that is connected to the segment (BL"), a second terminal that is connected to the segment (BL'), and a control terminal that is connected to the output terminal of the logic gate 7 for receiving the logic signal (S9) therefrom. In this embodiment, the switch 8 is implemented using an N-type transistor, but the disclosure is not limited thereto.

The negative voltage generator 2 is connected to the ground terminal of the write driver 41, is for receiving a write control signal (WTG) and the ground voltage, and generates, based on the write control signal (WTG) and the ground voltage, a reference voltage (VG1) for receipt by the ground terminal of the write driver 41. The reference voltage (VG1) is lower than the ground voltage when the write control signal (WTG) is in a first logic state (e.g., the logic one state), and is equal to the ground voltage when the write control signal (WTG) is in a second logic state (e.g., the logic zero state). In this embodiment, the negative voltage generator 2 includes an inverter 21, a capacitive element 22 and a switch 23. Connections and operations of the inverter 21, the capacitive element 22 and the switch 23 are the same as those of the first embodiment, and details thereof are omitted for the sake of brevity.

The protector 5 is connected to the output terminal of the inverter 21, the power terminal of the write controller 31 and the power terminal of the logic gate 7, is for receiving the write control signal (WTG) and the supply voltage (VCC1), and generates, based on the write control signal (WTG) and the supply voltage (VCC1), a reference voltage (VCC2) for receipt by the power terminal of the write controller 31 and the power terminal of the logic gate 7. The reference voltage (VCC2) is lower than the supply voltage (VCC1) when the write control signal (WTG) is in the first logic state (i.e., the logic one state), and is equal to the supply voltage (VCC1) when the write control signal (WTG) is in the second logic state (i.e., the logic zero state). As a result, a voltage of each of the logic signals (S7, S9) when being in the logic one state is lower when the write control signal (WTG) is in the first logic state than when the write control signal (WTG) is in the second logic state.

In this embodiment, the protector 5 includes a switch 53 and a capacitive element 52. The switch 53 has a first terminal that is for receiving the supply voltage (VCC1), a second terminal that is connected to the power terminal of the write controller 31 and the power terminal of the logic gate 7, and a control terminal that is for receiving the write control signal (WTG). The switch 53 does not conduct when the write control signal (WTG) is in the first logic state (i.e., the logic one state), and conducts when the write control signal (WTG) is in the second logic state (i.e., the logic zero state). The switch 53 is implemented using a P-type transistor in this embodiment, but the disclosure is not limited thereto. The capacitive element 52 is connected between the second terminal of the switch 53 and the output terminal of the inverter 21. The capacitive element 52 has a capacitance smaller than that of the capacitive element 22 in the embodiment, but the disclosure is not limited thereto. Each of the capacitive elements 22, 52 is implemented using an N-type transistor in this embodiment, but the disclosure is not limited thereto. The reference voltage (VCC2) is provided at the second terminal of the switch 53.

When the write control signal (WTG) is in the second logic state (i.e., the logic zero state), the switches 23, 53 both conduct, making the reference voltage (VG1) equal to the ground voltage and the reference voltage (VCC2) equal to the supply voltage (VCC1). At this time, the voltage of each of the logic signals (S7, S9) when being in the logic one state is equal to the supply voltage (VCC1). Thereafter, when the write control signal (WTG) enters the first logic state (i.e., the logic one state), the switches 23, 53 no longer conduct, the reference voltage (VG1) is decreased below the ground voltage because of coupling effect provided by the capacitive element 22, and the reference voltage (VCC2) is decreased below the supply voltage (VCC1) because of coupling effect provided by the capacitive element 52. At this time, the voltage of each of the logic signals (S7, S9) when being in the logic one state is lower than the supply voltage (VCC1).

Since the capacitance of the capacitive element 52 is smaller than the capacitance of the capacitive element 22, a difference between the supply voltage (VCC1) and the reference voltage (VCC2) is smaller than a difference between the ground voltage and the reference voltage (VG1) when the write control signal (WTG) is in the first logic state (i.e., the logic one state). In other words, when the write control signal (WTG) is in the first logic state, whether the difference between the supply voltage (VCC1) and the reference voltage (VCC2) is smaller or greater than the difference between the ground voltage and the reference voltage (VG1) depends on whether the capacitance of the capacitive element 52 is smaller or greater than the capacitance of the capacitive element 22.

As compared to the conventional SRAM device, stress voltage endured by each of the write driver 41 and the switch 8 when a corresponding one of the logic signals (S7, S9) is in the logic one state is decreased without influencing power consumption and operation speed of the memory device of this embodiment, since the voltage of the corresponding one of the logic signals (S7, S9) when being in the logic one state is decreased below the supply voltage (VCC1) when the reference voltage (VG1) is decreased below the ground voltage. In other words, each of a first gap voltage ($V_{GAP1}$), which is between the input terminal and the ground terminal of the write driver 41 when the logic signal (S7) is in the logic one state, and a third gap voltage ($V_{GAP3}$), which is between the control terminal and the second terminal of the switch 8 when the logic signal (S9) is in the logic one state, is lower than the voltage between the input terminal and the ground terminal of the write driver 92 (see FIG. 1) of the conventional SRAM device when the logic signal (D) (see FIG. 1) is in the logic one state.

It should be noted that, when a number of memory cells of a memory device is large (i.e., the memory device has high storage capacity), for each bit line, a plurality of switches can be disposed on the bit line to divide the bit line into a plurality of segments. Therefore, it is possible that only some of the memory cells operate at a time, thereby achieving power saving and load reduction. The switch 8 shown in FIG. 4 is an example of this kind of switches.

Figure 5:
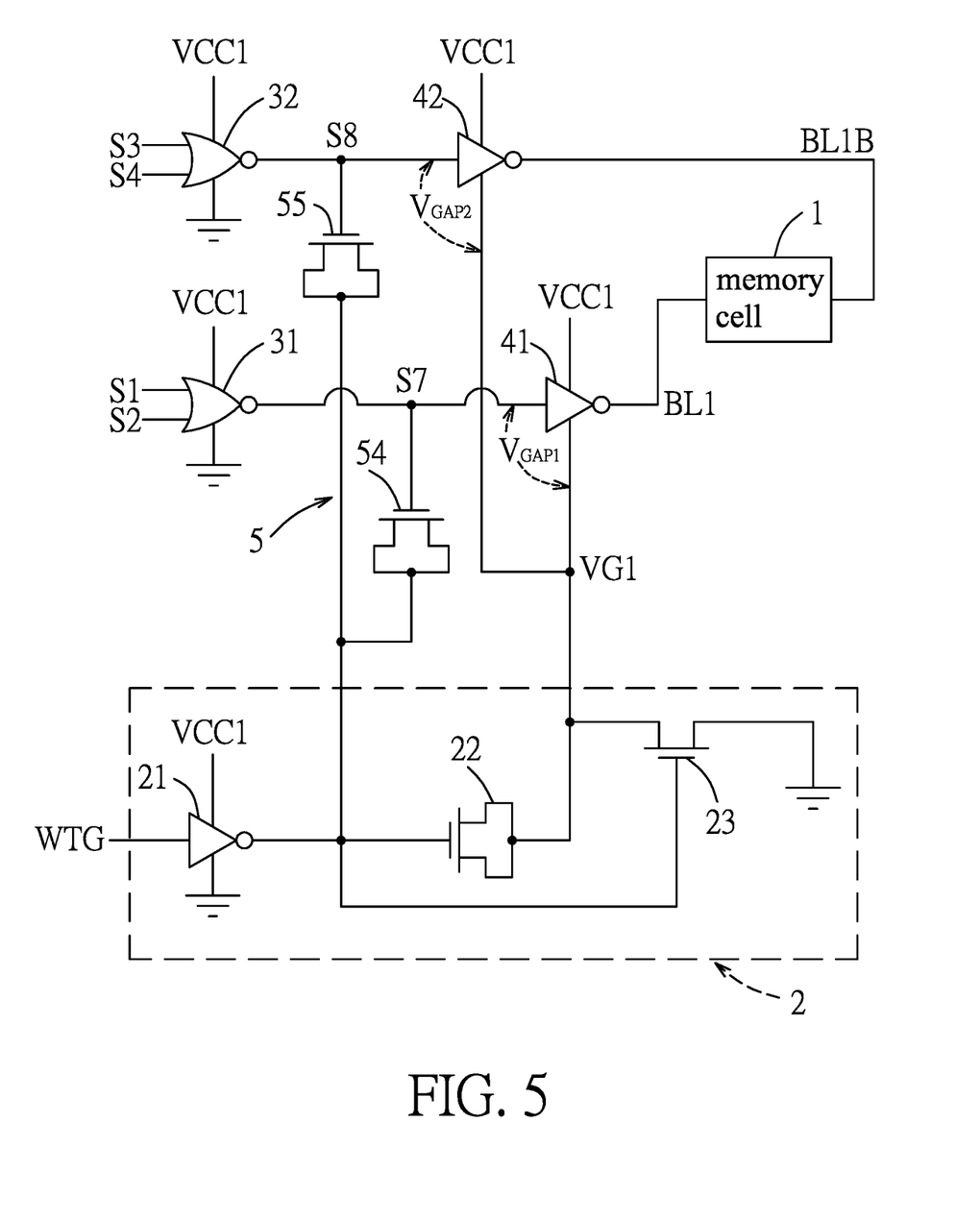
FIG. 5 is a circuit block diagram illustrating a third embodiment of the memory device according to the disclosure.

FIG. 5 illustrates a third embodiment of the memory device according to the disclosure. For convenience of illustration of this embodiment, a memory cell 1, two bit lines (BL1, BL1B) (one of which is a non-inverting bit line, and the other one of which is an inverting bit line), two write controllers 31, 32, two write drivers 41, 42, a negative voltage generator 2 and a protector 5 of the memory device are depicted in FIG. 5 and will be described in detail below, and other elements of the memory device are omitted in FIG. 5 and the following description.

The bit line (BL1) is connected to the memory cell 1. The write controller 31 is similar to that of each of the first and second embodiments, except that the power terminal of the write controller 31 is for receiving the supply voltage (VCC1) instead of the reference voltage (VCC2) (see FIGS. 2 and 4). The write driver 41 is the same as that of the first embodiment.

The bit line (BL1B) is connected to the memory cell 1. The write controller 32 has a power terminal that is for receiving the supply voltage (VCC1), a ground terminal that is for receiving the ground voltage, and an output terminal that outputs a logic signal (S8). In this embodiment, the write controller 32 is implemented using a two-input NOR gate that generates the logic signal (S8) based on two logic signals (S3, S4). The logic signal (S8) is in the logic one state when the logic signals (S3, S4) are both in the logic zero state. However, in other embodiments, the write controller 32 may be implemented using a logic gate other than the two-input NOR gate. The write driver 42 has a power terminal that is for receiving the supply voltage (VCC1), a ground terminal, an input terminal that is connected to the output terminal of the write controller 32 for receiving the logic signal (S8) therefrom, and an output terminal that is connected to the bit line (BL1B).

The negative voltage generator 2 of this embodiment is similar to that of the second embodiment, except that it is connected further to the ground terminal of the write driver 42 for providing the reference voltage (VG1) thereto.

The protector 5 is connected to the output terminals of the write controllers 31, 32 and the output terminal of the inverter 21, and causes a voltage of each of the logic signals (S7, S8) when being in the logic one state to be lower when the write control signal (WTG) is in the first logic state (i.e., the logic one state) than when the write control signal (WTG) is in the second logic state (i.e., the logic zero state).

In this embodiment, the protector 5 includes two capacitive elements 54, 55. The capacitive element 54 is connected between the output terminal of the write controller 31 and the output terminal of the inverter 21. The capacitive element 55 is connected between the output terminal of the write controller 32 and the output terminal of the inverter 21. Each of the capacitive elements 54, 55 has a capacitance smaller than that of the capacitive element 22 in this embodiment, but the disclosure is not limited thereto. Each of the capacitive elements 22, 54, 55 is implemented using an N-type transistor in this embodiment, but the disclosure is not limited thereto.

When the write control signal (WTG) is in the second logic state (i.e., the logic zero state), the switch 23 conducts, making the reference voltage (VG1) equal to the ground voltage, and the voltage of each of the logic signals (S7, S8) when being in the logic one state is equal to the supply voltage (VCC1). Thereafter, when the write control signal (WTG) enters the first logic state (i.e., the logic one state), the switch 23 no longer conducts, the reference voltage (VG1) is decreased below the ground voltage because of coupling effect provided by the capacitive element 22, and the voltage of each of the logic signals (S7, S8) when being in the logic one state is decreased below the supply voltage (VCC1) because of coupling effect provided by a corresponding one of the capacitive elements 54, 55.

Since the capacitance of each of the capacitive elements 54, 55 is smaller than the capacitance of the capacitive element 22, a difference between the supply voltage (VCC1) and the voltage of each of the logic signals (S7, S8) when being in the logic one state is smaller than a difference between the ground voltage and the reference voltage (VG1) when the write control signal (WTG) is in the first logic state (i.e., the logic one state). In other words, when the write control signal (WTG) is in the first logic state, whether the difference between the supply voltage (VCC1) and the voltage of each of the logic signals (S7, S8) when being in the logic one state is smaller or greater than the difference between the ground voltage and the reference voltage (VG1) depends on whether the capacitance of the corresponding one of the capacitive elements 54, 55 is smaller or greater than the capacitance of the capacitive element 22.

As compared to the conventional SRAM device, stress voltage endured by each of the write drivers 41, 42 when a corresponding one of the logic signals (S7, S8) is in the logic one state is decreased without influencing power consumption and operation speed of the memory device of this embodiment, since the voltage of the corresponding one of the logic signals (S7, S8) when being in the logic one state is decreased below the supply voltage (VCC1) when the reference voltage (VG1) is decreased below the ground voltage. In other words, each of a first gap voltage ($V_{GAP1}$), which is between the input terminal and the ground terminal of the write driver 41 when the logic signal (S7) is in the logic one state, and a second gap voltage ($V_{GAP2}$), which is between the input terminal and the ground terminal of the write driver 42 when the logic signal (S8) is in the logic one state, is lower than the voltage between the input terminal and the ground terminal of the write driver 92 (see FIG. 1) of the conventional SRAM device when the logic signal (D) (see FIG. 1) is in the logic one state.

Figure 6:
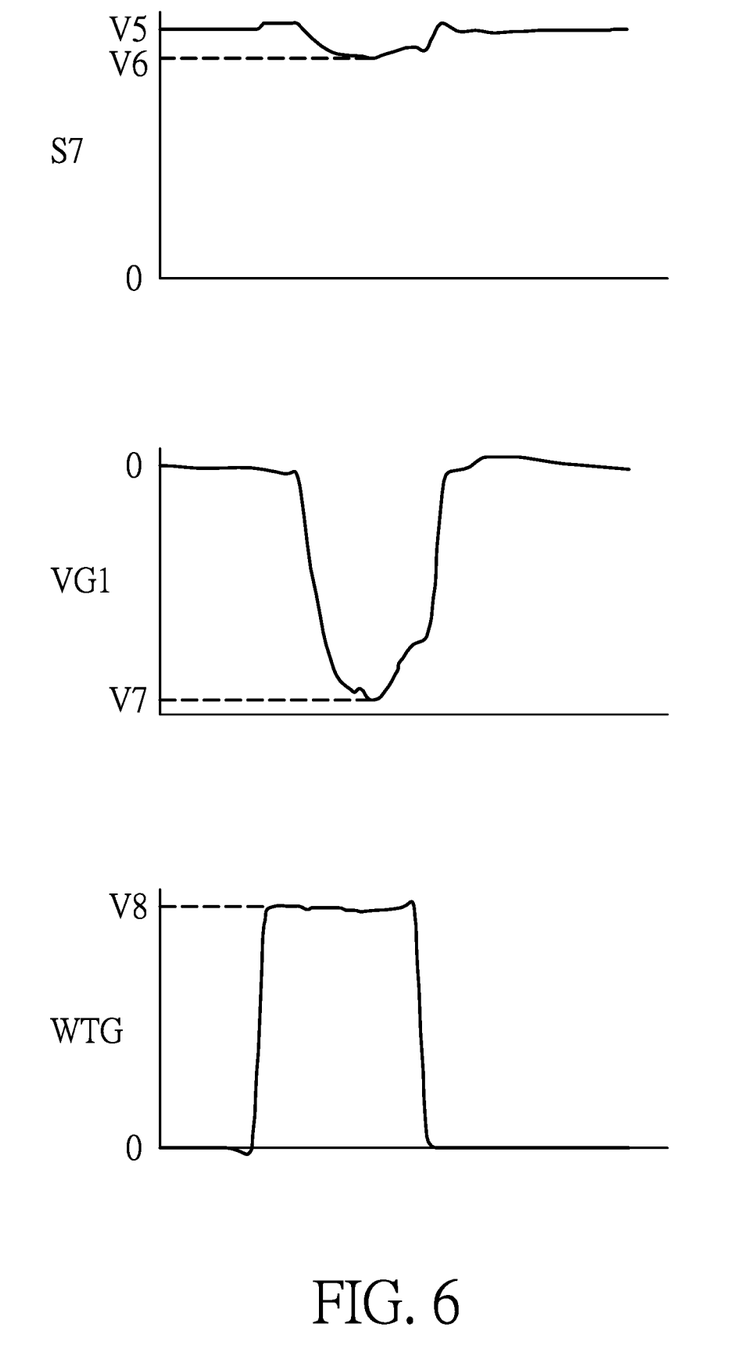
FIG. 6 is a timing diagram illustrating a logic signal, a reference voltage and a write control signal of the third embodiment.

FIG. 6 exemplarily illustrates relationships among the logic signal (S7), the reference voltage (VG1) and the write control signal (WTG). When the write control signal (WTG) is in the second logic state (i.e., the logic zero state) and has a voltage equal to the ground voltage of 0 Volt, the reference voltage (VG1) is equal to the ground voltage, and the voltage of the logic signal (S7) when being in the logic one state is equal to the supply voltage (VCC1) of V5 Volts. When the write control signal (WTG) is in the first logic state (i.e., the logic one state) and has a voltage of V8 Volts, the reference voltage (VG1) is lower than the ground voltage and is V7 Volts, and the voltage of the logic signal (S7) when being in the logic one state is lower than the supply voltage (VCC1) and is V6 Volts. In this embodiment, a difference between 0 and V7 (i.e., 0–V7) is greater than a difference between V5 and V6 (i.e., V5–V6).

Figure 7:
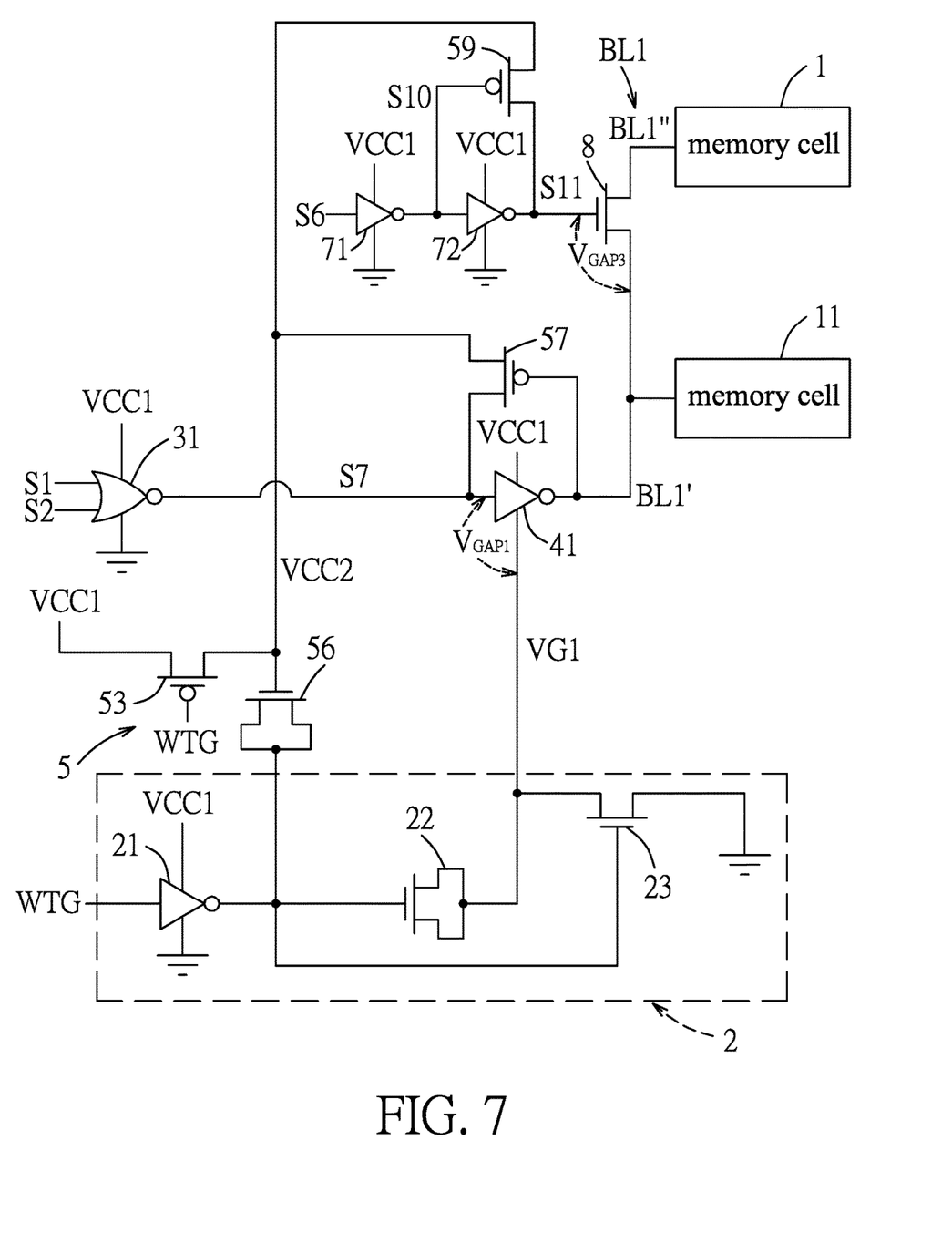
FIG. 7 is a circuit block diagram illustrating a fourth embodiment of the memory device according to the disclosure.

FIG. 7 illustrates a fourth embodiment of the memory device according to the disclosure. For convenience of illustration of this embodiment, two memory cells 1, 11, a bit line (BL1) (which may be a non-inverting bit line or an inverting bit line), a write controller 31, a write driver 41, a logic gate 71, an inverter 72, a switch 8, a negative voltage generator 2 and a protector 5 of the memory device are depicted in FIG. 7 and will be described in detail below, and other elements of the memory device are omitted in FIG. 7 and the following description.

The bit line (BL1) includes two segments (BL1", BL1'), one of which (BL1") is connected to the memory cell 1, and the other one of which (BL1') is connected to the memory cell 11.

The write controller 31 is similar to that of the second embodiment, except that the power terminal of the write controller 31 is for receiving the supply voltage (VCC1) instead of the reference voltage (VCC2) (see FIG. 4). The write driver 41 is the same as that of the second embodiment. The negative voltage generator 2 is the same as that of the second embodiment.

The logic gate 71 has a power terminal that is for receiving the supply voltage (VCC1), a ground terminal that is for receiving the ground voltage, and an output terminal that outputs a logic signal (S10). In this embodiment, the logic gate 71 is implemented using an inverter that generates the logic signal (S10) based on a logic signal (S6). However, in other embodiments, the logic gate 71 may be implemented using a logic gate other than the inverter.

The inverter 72 has a power terminal that is for receiving the supply voltage (VCC1), a ground terminal that is for receiving the ground voltage, an input terminal that is connected to the output terminal of the logic gate 71 for receiving the logic signal (S10) therefrom, and an output terminal that outputs a logic signal (S11).

The switch 8 has a first terminal that is connected to the segment (BL"), a second terminal that is connected to the segment (BL'), and a control terminal that is connected to the output terminal of the inverter 72 for receiving the logic signal (S11) therefrom. In this embodiment, the switch 8 is implemented using an N-type transistor, but the disclosure is not limited thereto.

The protector 5 is connected to the output terminal of the write controller 31, the output terminal of the inverter 72 and the output terminal of the inverter 21, and is for receiving the write control signal (WTG) and the supply voltage (VCC1). The protector 5 causes a voltage of each of the logic signals (S7, S11) when being in the logic one state to be lower when the write control signal (WTG) is in the first logic state (i.e., the logic one state) than when the write control signal (WTG) is in the second logic state (i.e., the logic zero state).

In this embodiment, the protector 5 includes a capacitive element 56 and three switches 53, 57, 59. The capacitive element 56 has a first terminal, and a second terminal that is connected to the output terminal of the inverter 21. The capacitive element 56 has a capacitance smaller than that of the capacitive element 22 in this embodiment, but the disclosure is not limited thereto. Each of the capacitive elements 22, 56 is implemented using an N-type transistor in this embodiment, but the disclosure is not limited thereto. The switch 53 has a first terminal that is for receiving the supply voltage (VCC1), a second terminal that is connected to the first terminal of the capacitive element 56, and a control terminal that is for receiving the write control signal (WTG). The switch 53 does not conduct when the write control signal (WTG) is in the first logic state (i.e., the logic one state), and conducts when the write control signal (WTG) is in the second logic state (i.e., the logic zero state). The switch 57 has a first terminal that is connected to the first terminal of the capacitive element 56, a second terminal that is connected to the output terminal of the write controller 31, and a control terminal that is connected to the output terminal of the write driver 41. The switch 57 conducts when the logic signal (S7) is in the logic one state, and does not conduct when the logic signal (S7) is in the logic zero state. The switch 59 has a first terminal that is connected to the first terminal of the capacitive element 56, a second terminal that is connected to the output terminal of the inverter 72, and a control terminal that is connected to the output terminal of the logic gate 71 for receiving the logic signal (S10) therefrom. The switch 59 does not conduct when the logic signal (S10) is in the logic one state, and conducts when the logic signal (S10) is in the logic zero state. Each of the switches 53, 57, 59 is implemented using a P-type transistor in this embodiment, but the disclosure is not limited thereto. A reference voltage (VCC2) is provided at the first terminal of the capacitive element 56, is lower than the supply voltage (VCC1) when the write control signal (WTG) is in the first logic state, and is equal to the supply voltage (VCC1) when the write control signal (WTG) is in the second logic state.

When the write control signal (WTG) is in the second logic state (i.e., the logic zero state), the switches 23, 53 both conduct, making the reference voltage (VG1) equal to the ground voltage and the reference voltage (VCC2) equal to the supply voltage (VCC1). At this time, the voltage of each of the logic signals (S7, S11) when being in the logic one state is equal to the supply voltage (VCC1) because of conduction of a corresponding one of the switches 57, 59. Thereafter, when the write control signal (WTG) enters the first logic state (i.e., the logic one state), the switches 23, 53 no longer conduct, the reference voltage (VG1) is decreased below the ground voltage because of coupling effect provided by the capacitive element 22, and the reference voltage (VCC2) is decreased below the supply voltage (VCC1) because of coupling effect provided by the capacitive element 56. At this time, the voltage of each of the logic signals (S7, S11) when being in the logic one state is lower than the supply voltage (VCC1) because of conduction of the corresponding one of the switches 57, 59.

Since the capacitance of the capacitive element 56 is smaller than the capacitance of the capacitive element 22, a difference between the supply voltage (VCC1) and the reference voltage (VCC2) is smaller than a difference between the ground voltage and the reference voltage (VG1) when the write control signal (WTG) is in the first logic state (i.e., the logic one state). Therefore, when the write control signal (WTG) is in the first logic state, a difference between the supply voltage (VCC1) and the voltage of each of the logic signals (S7, S11) when being in the logic one state is smaller than the difference between the ground voltage and the reference voltage (VG1). In other words, when the write control signal (WTG) is in the first logic state, whether the difference between the supply voltage (VCC1) and the voltage of each of the logic signals (S7, S11) when being in the logic one state is smaller or greater than the difference between the ground voltage and the reference voltage (VG1) depends on whether the capacitance of the capacitive element 56 is smaller or greater than the capacitance of the capacitive element 22.

As compared to the conventional SRAM device, stress voltage endured by each of the write driver 41 and the switch 8 when a corresponding one of the logic signals (S7, S11) is in the logic one state is decreased without influencing power consumption and operation speed of the memory device of this embodiment, since the voltage of the corresponding one of the logic signals (S7, S11) when being in the logic one state is decreased below the supply voltage (VCC1) when the reference voltage (VG1) is decreased below the ground voltage. In other words, each of a first gap voltage ($V_{GAP1}$), which is between the input terminal and the ground terminal of the write driver 41 when the logic signal (S7) is in the logic one state, and a third gap voltage ($V_{GAP3}$), which is between the control terminal and the second terminal of the switch 8 when the logic signal (S11) is in the logic one state, is lower than the voltage between the input terminal and the ground terminal of the write driver 92 (see FIG. 1) of the conventional SRAM device when the logic signal (D) (see FIG. 1) is in the logic one state.

In view of the above, for each of the aforesaid embodiments, by virtue of the protector 5 that decreases the voltage(s) of the logic signal(s) (S7-S9, S11) when being in the logic one state to be below the supply voltage (VCC1) when the negative voltage generator 2 decreases the reference voltage (VG1) to be below the ground voltage, the stress voltage(s) endured by the write driver(s) 41, 42 and/or the stress voltage endured by the switch 8 when the corresponding one(s) of the logic signals (S7-S9, S11) is(are) in the logic one state is(are) decreased without influencing the power consumption and the operation speed of the memory device as compared to the conventional SRAM device.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that the disclosure is not limited to the disclosed embodiments but is intended to cover various arrangements included within the spirit and scope of the broadest interpretation so as to encompass all such modifications and equivalent arrangements.

What is claimed is:

1. A memory device comprising:
   at least one memory cell;
   a bit line connected to said at least one memory cell;
   a write controller having a power terminal, and an output terminal that outputs a first logic signal;
   a write driver having a ground terminal, an input terminal that is connected to said output terminal of said write controller to receive the first logic signal therefrom, and an output terminal that is connected to said bit line;
   a negative voltage generator connected to said ground terminal of said write driver, configured to receive a write control signal and a ground voltage, and generating a first reference voltage for receipt by said ground terminal of said write driver, the first reference voltage being lower than the ground voltage when the write control signal is in a first logic state, and being equal to the ground voltage when the write control signal is in a second logic state; and
   a protector connected to said power terminal of said write controller, configured to:
      receive the write control signal and a supply voltage, and
      generate a second reference voltage for receipt by said power terminal of said write controller,
      the second reference voltage being lower than the supply voltage when the write control signal is in the first logic state, and being equal to the supply voltage when the write control signal is in the second logic state.

2. The memory device of claim 1, wherein said protector causes a voltage of the first logic signal when being in a logic one state to be lower when the write control signal is in the first logic state than when the write control signal is in the second logic state.

3. The memory device of claim 1, wherein said negative voltage generator includes:
   an inverter having an input terminal that is configured to receive the write control signal, and an output terminal;
   a capacitive element having a first terminal that is connected to said ground terminal of said write driver, and a second terminal that is connected to said output terminal of said inverter; and a switch having a first terminal that is configured to receive the ground voltage, a second terminal that is connected to said first terminal of said capacitive element, and a control terminal that is connected to said output terminal of said inverter, said switch not conducting when the write control signal is in the first logic state, and conducting when the write control signal is in the second logic state;

the first reference voltage being provided at said first terminal of said capacitive element.

4. The memory device of claim 1, wherein said protector includes a transmission gate that is connected to said power terminal of said write controller, that is configured to receive the write control signal and the supply voltage, and that transmits the supply voltage based on the write control signal to generate the second reference voltage for receipt by said power terminal of said write controller.

5. The memory device of claim 1, wherein said protector includes:
- a switch having a first terminal that is configured to receive the supply voltage, a second terminal that is connected to said power terminal of said write controller, and a control terminal that is configured to receive the write control signal, said switch not conducting when the write control signal is in the first logic state, and conducting when the write control signal is in the second logic state; and
- a capacitive element having a first terminal that is connected to said second terminal of said switch and a second terminal;
- the second reference voltage being provided at said second terminal of said switch.

6. The memory device of claim 5, further comprising:
an inverter having an input terminal that is configured to receive the write control signal, and an output terminal that is connected to said second terminal of said capacitive element.

7. The memory device of claim 1, further comprising another at least one memory cell, a logic gate and a switch, wherein:
- said bit line includes a first segment that is connected to said at least one memory cell, and a second segment that is connected to said another at least one memory cell and said output terminal of said write driver;
- said logic gate has a power terminal that is connected to said protector to receive the second reference voltage therefrom, and an output terminal;
- said switch has a first terminal that is connected to said first segment, a second terminal that is connected to said second segment, and a control terminal that is connected to said output terminal of said logic gate.

8. A memory device comprising:
at least one memory cell;
a bit line connected to said at least one memory cell;
a write controller having a power terminal, and an output terminal that outputs a first logic signal;
a write driver having a ground terminal, an input terminal that is connected to said output terminal of said write controller to receive the first logic signal therefrom, and an output terminal that is connected to said bit line;
a negative voltage generator connected to said ground terminal of said write driver, configured to receive a write control signal and a ground voltage, and generating a first reference voltage for receipt by said ground terminal of said write driver, the first reference voltage being lower than the ground voltage when the write control signal is in a first logic state, and being equal to the ground voltage when the write control signal is in a second logic state; and
a protector including a capacitive element having a first terminal that is connected to said output terminal of said write controller and a second terminal.

9. The memory device of claim 8, further comprising:
an inverter having an input terminal that is configured to receive the write control signal, and an output terminal that is connected to said second terminal of said capacitive element.

10. A memory device, comprising:
at least one memory cell;
a bit line connected to said at least one memory cell;
a write controller having a power terminal, and an output terminal that outputs a first logic signal;
a write driver having a ground terminal, an input terminal that is connected to said output terminal of said write controller to receive the first logic signal therefrom, and an output terminal that is connected to said bit line;
a negative voltage generator connected to said ground terminal of said write driver, configured to receive a write control signal and a ground voltage, and generating a first reference voltage for receipt by said ground terminal of said write driver, the first reference voltage being lower than the ground voltage when the write control signal is in a first logic state, and being equal to the ground voltage when the write control signal is in a second logic state; and
a protector connected to said output terminal of said write controller, and including:
- a capacitive element having a first terminal and a second terminal; and
- a first switch having a first terminal that is configured to receive a supply voltage,
- a second terminal that is connected to said first terminal of said capacitive element, and
- a control terminal that is configured to receive the write control signal, said first switch not conducting when the write control signal is in the first logic state, and conducting when the write control signal is in the second logic state.

11. The memory device of claim 10, further comprising:
an inverter having an input terminal that is configured to receive the write control signal, and an output terminal that is connected to said second terminal of said capacitive element.

* * * * *